United States Patent
Kim et al.

(10) Patent No.: US 7,417,286 B2
(45) Date of Patent: Aug. 26, 2008

(54) SEMICONDUCTOR INTEGRATED CIRCUIT DEVICES HAVING SINGLE CRYSTALLINE THIN FILM TRANSISTORS AND METHODS OF FABRICATING THE SAME

(75) Inventors: Sung-Jin Kim, Hwaseong-si (KR);
Soon-Moon Jung, Seongnam-si (KR);
Won-Seok Cho, Suwon-si (KR);
Jae-Hoon Jang, Hwaseong-si (KR);
Jong-Hyuk Kim, Incheon (KR);
Kun-Ho Kwak, Yongin-si (KR); Hoon Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 11/280,045

(22) Filed: Nov. 15, 2005

(65) Prior Publication Data

US 2006/0102959 A1    May 18, 2006

(30) Foreign Application Priority Data

Nov. 16, 2004   (KR) .................. 10-2004-0093742

(51) Int. Cl.
*H01L 23/62* (2006.01)
(52) U.S. Cl. ................. 257/353; 257/347; 257/352
(58) Field of Classification Search ............. 257/69, 257/E21.43, 621, 347, 352, 353
See application file for complete search history.

(56) References Cited

U.S. PATENT DOCUMENTS

| | | | | |
|---|---|---|---|---|
| 5,296,727 A * | 3/1994 | Kawai et al. | ................. | 257/260 |
| 5,837,604 A * | 11/1998 | Jun | ................. | 438/641 |
| 5,898,189 A | 4/1999 | Gardner et al. | ................. | 257/661 |
| 6,022,766 A | 2/2000 | Chen et al. | ................. | 438/152 |
| 6,429,484 B1 * | 8/2002 | Yu | ................. | 257/347 |
| 6,723,589 B2 | 4/2004 | Lee | | |
| 6,818,489 B2 * | 11/2004 | Kim et al. | ................. | 438/197 |
| 6,902,980 B2 * | 6/2005 | Wang et al. | ................. | 438/305 |
| 2004/0169221 A1 * | 9/2004 | Ko et al. | ................. | 257/330 |
| 2005/0184292 A1 * | 8/2005 | Kwak et al. | ................. | 257/70 |
| 2006/0049467 A1 * | 3/2006 | Lim et al. | ................. | 257/383 |
| 2006/0097319 A1 * | 5/2006 | Kim et al. | ................. | 257/353 |

FOREIGN PATENT DOCUMENTS

| | | |
|---|---|---|
| JP | 06-334148 | 12/1994 |
| JP | 07-211799 | 8/1995 |
| KR | 10-2000-0045456 | 7/2000 |
| KR | 1020020096743 | 12/2002 |

* cited by examiner

*Primary Examiner*—Douglas M Menz
(74) *Attorney, Agent, or Firm*—Mills & Onello LLP

(57) ABSTRACT

Semiconductor integrated circuit devices having single crystalline thin film transistors and methods of fabricating the same are provided. The semiconductor integrated circuit devices include an interlayer insulating layer formed on a semiconductor substrate and a single crystalline semiconductor plug penetrating the interlayer insulating layer. A single crystalline semiconductor body pattern is provided on the interlayer insulating layer. The single crystalline semiconductor body pattern has an elevated region and contacts the single crystalline semiconductor plug. The method of forming the single crystalline semiconductor body pattern having the elevated region includes forming a sacrificial layer pattern covering the single crystalline semiconductor plug on the interlayer insulating layer. A capping layer is formed to cover the sacrificial layer pattern and the interlayer insulating layer, and the capping layer is patterned to form an opening which exposes a portion of the sacrificial layer pattern. Subsequently, the sacrificial layer pattern is selectively removed to form a cavity in the capping layer, and a planarized single crystalline semiconductor body pattern is formed to fill the cavity and the opening.

11 Claims, 4 Drawing Sheets

SEMICONDUCTOR INTEGRATED CIRCUIT DEVICES HAVING SINGLE CRYSTALLINE THIN FILM TRANSISTORS AND METHODS OF FABRICATING THE SAME

CROSS-REFERENCE TO RELATED APPLICATION

This application claims the benefit of Korean Patent Application No. 10-2004-0093742, filed Nov. 16, 2004, the contents of which are hereby incorporated herein by reference in their entirety.

BACKGROUND OF THE INVENTION

1. Field of the Invention

The present invention relates to semiconductor devices and methods of fabricating the same and, more particularly, to semiconductor integrated circuit devices having single crystalline thin film transistors and methods of fabricating the same.

2. Description of the Related Art

Static random access memories (SRAMs) of semiconductor integrated circuit devices have advantages of low power consumption and fast operating speed as compared to dynamic RAMs (DRAMs). The SRAMs are thus widely used in portable appliances or cache memory devices of computers.

Unit cells of SRAM devices are typically classified into two categories. One is a high load resistor SRAM cell employing a high-resistance resistor as a load device, and the other is a complementary metal oxide semiconductor (CMOS) SRAM cell employing a P-channel MOS (PMOS) transistor as a load device.

The CMOS SRAM cell is again classified into two types. One is a thin film transistor (TFT) SRAM cell employing a TFT stacked on a semiconductor substrate as a load device, and the other is a bulk CMOS SRAM cell employing a bulk transistor formed at a semiconductor substrate as a load device.

The bulk CMOS SRAM cell exhibits high cell stability as compared to the TFT SRAM cell and the high resistor SRAM cell. That is, the bulk CMOS SRAM cell has an excellent low operation voltage characteristic and a low stand-by current characteristic. This is because all transistors constituting the bulk CMOS SRAM cell are formed on a single crystalline silicon substrate whereas the TFT is typically fabricated using a polysilicon layer as a body layer. However, the bulk CMOS SRAM cell has low integration density and weak latch-up immunity as compared to the TFT SRAM cell. Accordingly, in order to implement a highly integrated SRAM device having high reliability, it is required to continuously improve the characteristics of the TFTs (load transistors) employed in the TFT SRAM cell.

Semiconductor devices having TFTs stacked on a semiconductor substrate are disclosed in U.S. Pat. No. 6,022,766 to Chen et al., entitled "Semiconductor structure incorporating thin film transistors and methods for its manufacture". According to Chen et al., a bulk transistor is formed at a single crystalline silicon substrate, and a TFT is stacked over the bulk transistor. A body layer of the TFT is fabricated by forming an amorphous silicon layer over the semiconductor substrate having the bulk transistor and then crystallizing the amorphous silicon layer through an annealing process. In this case, the body layer corresponds to a polysilicon layer having large grains. That is, it is difficult to transform the body layer into a perfect single crystalline silicon layer. As a result, it is difficult to form the TFT having the electrical characteristics of the bulk transistor. Accordingly, methods for improving the characteristics of the TFT stacked over the semiconductor substrate are required.

SUMMARY OF THE INVENTION

Embodiments of the invention provide semiconductor integrated circuit devices which include a TFT having improved characteristics.

Other embodiments of the invention provide methods of fabricating the semiconductor integrated circuit devices capable of improving the characteristics of the TFT.

In one aspect, the invention is directed to a semiconductor integrated circuit device. The semiconductor integrated circuit device includes an interlayer insulating layer formed on a semiconductor substrate. A predetermined region of the semiconductor substrate is exposed by a contact hole passing through the interlayer insulating layer. The contact hole is filled with a single crystalline semiconductor plug. A single crystalline semiconductor body pattern is provided on the interlayer insulating layer. The single crystalline semiconductor body pattern has an elevated region and is in contact with the single crystalline semiconductor plug.

In one embodiment, the semiconductor substrate is a single crystalline silicon substrate, and the single crystalline semiconductor plug is a single crystalline silicon plug.

The single crystalline semiconductor body pattern can include a recessed region having a lower surface than the elevated region.

The semiconductor integrated circuit device can further include an impurity region formed in the semiconductor substrate.

In another aspect, a semiconductor integrated circuit device of the invention includes a first transistor formed at a semiconductor substrate. The first transistor has first and second impurity regions of a first conductivity type and a first gate electrode. The first and second impurity regions of the first conductivity type are provided in the semiconductor substrate, and the first gate electrode is disposed over a channel region between the first and second impurity regions. An interlayer insulating layer is provided on the first transistor, and a single crystalline semiconductor body pattern having at least two elevated regions spaced apart from each other is provided on the interlayer insulating layer. A second transistor is provided at the single crystalline semiconductor body pattern. The second transistor has first and second impurity regions of a second conductivity type and a second gate electrode. The first and second impurity regions of the second conductivity type are provided in the elevated regions, respectively, and the second gate electrode is disposed over the single crystalline semiconductor body pattern between the first and second impurity regions of the second conductivity type.

In one embodiment, the first conductivity type is N-type. In one embodiment, the second conductivity type is a P-type.

The semiconductor integrated circuit device can further include a single crystalline semiconductor plug formed in the interlayer insulating layer to be in contact with one of the first and second impurity regions of the first transistor. The single crystalline semiconductor plug can be a single crystalline silicon plug.

In one embodiment, the single crystalline semiconductor body pattern is a single crystalline silicon pattern.

The single crystalline semiconductor body pattern can include at least one recessed region between the elevated regions. The second gate electrode can be disposed over the recessed region of the single crystalline semiconductor body pattern. The second gate electrode can be a recessed gate electrode.

In one embodiment, the first transistor is an access transistor or a driver transistor of a static random access memory (SRAM) cell. The second transistor can be a load transistor of the SRAM cell.

In still another aspect, the invention is directed to a method of fabricating a semiconductor integrated circuit device. The method includes forming an interlayer insulating layer on a semiconductor substrate and patterning the interlayer insulating layer to form a contact hole exposing a predetermined region of the semiconductor substrate. A single crystalline semiconductor contact plug is formed in the contact hole. A sacrificial layer pattern is formed on the interlayer insulating layer to cover the single crystalline semiconductor contact plug. A capping layer having an opening, which exposes a part of the sacrificial layer pattern, is formed on the interlayer insulating layer and the sacrificial layer pattern. The sacrificial layer pattern is removed to form a cavity in the capping layer. A planarized single crystalline semiconductor body pattern is formed to fill the cavity and the opening. The capping layer is removed to expose a surface of the single crystalline semiconductor body pattern.

In one embodiment, the method further comprises forming a transistor having source and drain regions of a first conductivity type and a gate electrode on the semiconductor substrate prior to formation of the interlayer insulating layer. The source and drain regions of the first conductivity type can be formed by implanting N-type impurity ions into the substrate. The contact hole can be formed to expose one of the source and drain regions of the first conductivity type.

Forming the single crystalline semiconductor contact plug can include: growing a single crystalline semiconductor layer filling the contact hole using a selective epitaxial growth technique that employs the semiconductor substrate as a seed layer; and planarizing the single crystalline semiconductor layer. The single crystalline semiconductor layer can be a single crystalline silicon layer.

Forming the planarized single crystalline semiconductor body pattern can include: forming a single crystalline semiconductor body layer filling the cavity and the opening using a selective epitaxial growth technique that employs the single crystalline semiconductor contact plug as a seed layer; and planarizing the single crystalline semiconductor body layer to expose a top surface of the capping layer. The single crystalline semiconductor body layer can be a single crystalline silicon layer.

Forming the sacrificial layer pattern can include: forming a sacrificial layer having an etch selectivity with respect to the interlayer insulating layer on the interlayer insulating layer and the single crystalline semiconductor contact plug; and patterning the sacrificial layer. The sacrificial layer can be formed of a flowable oxide (FOX) layer or a spin on glass (SOG) layer.

In one embodiment, the capping layer is formed of a material layer having an etch selectivity with respect to the sacrificial layer. The capping layer can be formed of a nitride layer or an oxynitride layer.

In one embodiment, the sacrificial layer pattern is removed using a wet etching technique.

In one embodiment, the single crystalline semiconductor body pattern is formed to have an elevated region filling the opening and a recessed region filling the cavity. The method can further include forming a single crystalline thin film transistor at the single crystalline semiconductor body pattern. Forming the single crystalline thin film transistor can include: forming a gate electrode crossing over the recessed region; and selectively implanting impurity ions into the elevated regions adjacent to the gate electrode to form elevated source and drain regions.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

FIGS. 1 to 8 are cross-sectional views illustrating methods of fabricating semiconductor integrated circuit devices in accordance with embodiments of the present invention.

Figure 1:
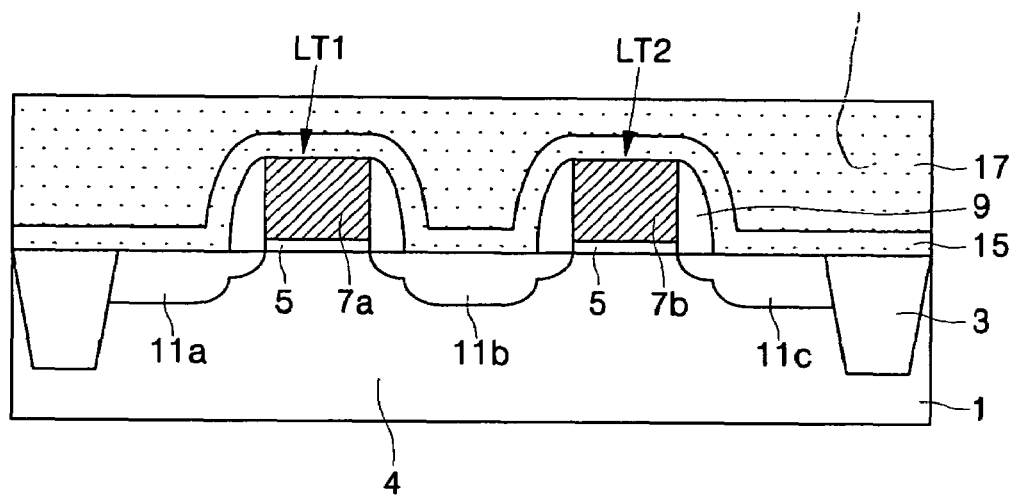
FIGS. 1 to 8 are cross-sectional views illustrating methods of fabricating semiconductor integrated circuit devices in accordance with embodiments of the present invention.

Referring to FIG. 1, an isolation layer 3 is formed in a predetermined region of a semiconductor substrate 1 such as a silicon substrate to define an active region 4. A lower gate insulating layer 5 and a lower gate material layer are sequentially formed on the active region 4. The lower gate material layer may be formed by sequentially stacking a gate conductive layer and a gate capping layer. Alternatively, the lower gate material layer may be formed of only the gate conductive layer. The gate conductive layer may be formed of a doped polysilicon layer or a metal layer, and the gate capping layer may be formed of an insulating layer such as a silicon oxide layer or a silicon nitride layer. The lower gate material layer is patterned to form first and second lower gate patterns 7a and 7b. In this case, the lower gate insulating layer 5 may also be patterned during formation of the first and second lower gate patterns 7a and 7b.

First impurity ions are implanted into the active region 4 using the lower gate patterns 7a and 7b as ion implantation masks to form low concentration impurity regions. The first impurity ions may be, for example, N-type impurity ions. Lower insulating spacers 9 are formed on sidewalls of the lower gate patterns 7a and 7b. Second impurity ions are implanted into the low concentration impurity regions using the lower gate patterns 7a and 7b and the lower insulating spacers 9 as ion implantation masks to form a high concentration impurity region. The second impurity ions may be, for example, N-type impurity ions. As a result, first to third lower impurity regions 11a, 11b, 11c composed of the low concentration impurity region and the high concentration impurity region are formed in the active region 4. In this case, the first to third lower impurity regions 11a, 11b and 11c are formed to have a lightly doped drain (LDD) structure.

The first lower gate pattern 7a, the first lower impurity region 11a and the second lower impurity region 11b constitute a first lower transistor LT1. In this case, the first and second lower impurity regions 11a and 11b may be a source region (or a drain region) and a drain region (or a source region) of the first lower transistor LT1, respectively. Further, the second lower gate pattern 7b, the second lower impurity region 11b and the third lower impurity region 11c constitute a second lower transistor LT2. In this case, the second and third lower impurity regions 11b and 11c may be a drain region (or a source region) and a source region (or a drain region) of the second lower transistor LT2, respectively. The first and second lower transistors LT1 and LT2 may be NMOS transistors.

An etch stop layer 15 may be formed on the substrate having the lower transistors LT1 and LT2. The etch stop layer 15 is formed to cover the lower gate patterns 7a and 7b as well as the lower impurity regions 11a, 11b and 11c. The etch stop layer 15 is preferably formed of a silicon nitride layer (SiN) or a silicon oxynitride layer (SiON). An interlayer insulating layer 17 is formed on the etch stop layer 15. The interlayer insulating layer 17 may be planarized using a chemical mechanical polishing (CMP) process. An insulating layer (not shown) having a uniform thickness may be additionally formed on the planarized interlayer insulating layer 17. The interlayer insulating layer 17 may be formed of a high density plasma (HDP) oxide layer.

Figure 2:
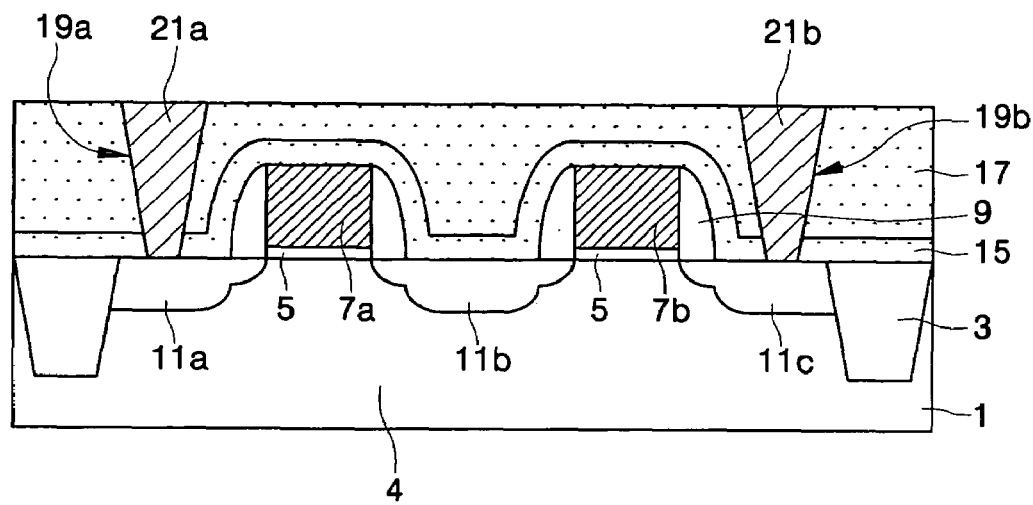

Referring to FIG. 2, the planarized interlayer insulating layer 17 and the etch stop layer 15 are patterned to form first and second contact holes 19a and 19b which expose the first and third lower impurity regions 11a and 11c, respectively. First and second single crystalline semiconductor contact plugs 21a and 21b are then formed to fill the first and second contact holes 19a and 19b, respectively. When the semiconductor substrate 1 is a silicon substrate, the single crystalline semiconductor contact plugs 21a and 21b may be single crystalline silicon plugs. The single crystalline semiconductor contact plugs 21a and 21b may be formed by growing a single crystalline semiconductor layer using a selective epitaxial growth (SEG) technique that employs the first and third lower impurity regions 11a and 11c as seed layers and by planarizing the single crystalline semiconductor layer to expose the interlayer insulating layer 17. As a result, top surfaces of the single crystalline semiconductor contact plugs 21a and 21b may have the same level as a top surface of the interlayer insulating layer 17. The single crystalline semiconductor layer may be planarized using a CMP process.

Figure 3:
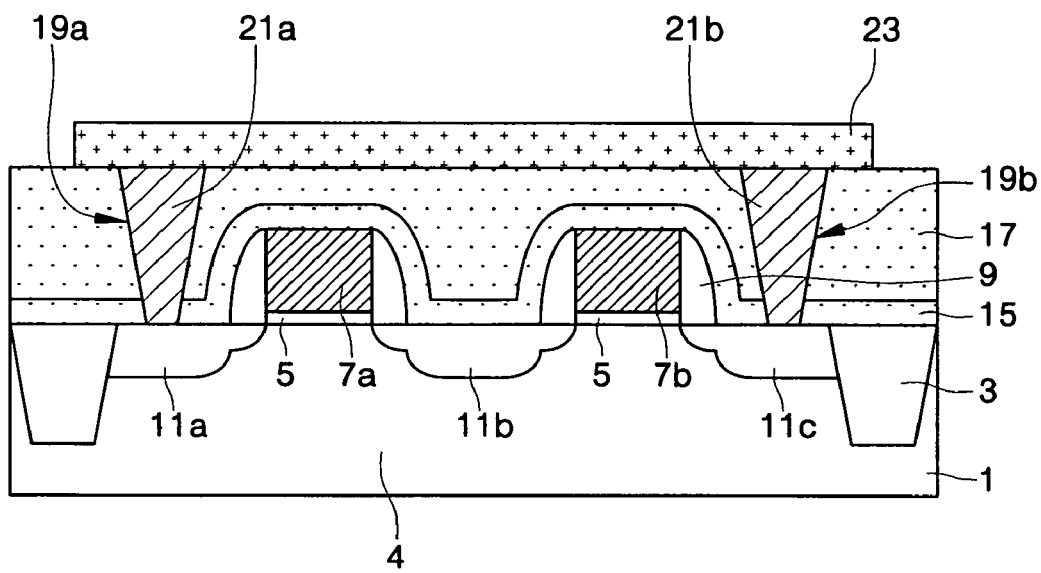

Referring to FIG. 3, a sacrificial layer is formed on the single crystalline semiconductor plugs 21a and 21b and the interlayer insulating layer 17. The sacrificial layer is patterned to form a sacrificial layer pattern 23 covering the single crystalline semiconductor contact plugs 21a and 21b. The sacrificial layer may be formed of a material layer having an etch selectivity with respect to the interlayer insulating layer 17. For example, when the interlayer insulating layer 17 is formed of the HDP oxide layer as described above, the sacrificial layer may be formed of a flowable oxide (FOX) layer or a spin on glass (SOG) layer which has a wet etch selectivity with respect to the HDP oxide layer. The sacrificial layer pattern 23, i.e., the sacrificial layer, may be formed to a predetermined thickness corresponding to the thickness of a single crystalline semiconductor body pattern to be formed in a subsequent process. In addition, the sacrificial layer pattern 23 may define a shape of the single crystalline semiconductor body pattern.

Figure 4:
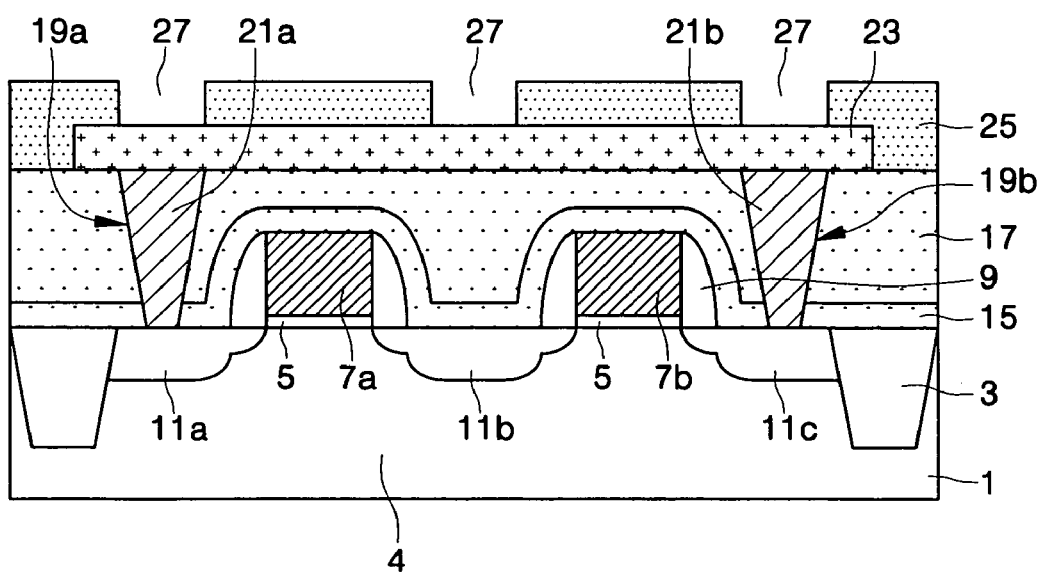

Referring to FIG. 4, a capping layer 25 is formed on the sacrificial layer pattern 23 and the interlayer insulating layer 17. For example, the capping layer 25 may be formed of a nitride layer or an oxynitride layer having an etch selectivity with respect to the sacrificial layer pattern 23. The capping layer 25 is patterned to form openings 27 exposing predetermined regions of the sacrificial layer pattern 23. The openings 27 define locations of impurity regions (i.e., source and drain regions) of upper transistors to be formed in a subsequent process. The openings 27 may be formed using a photolithography technique.

Figure 5:
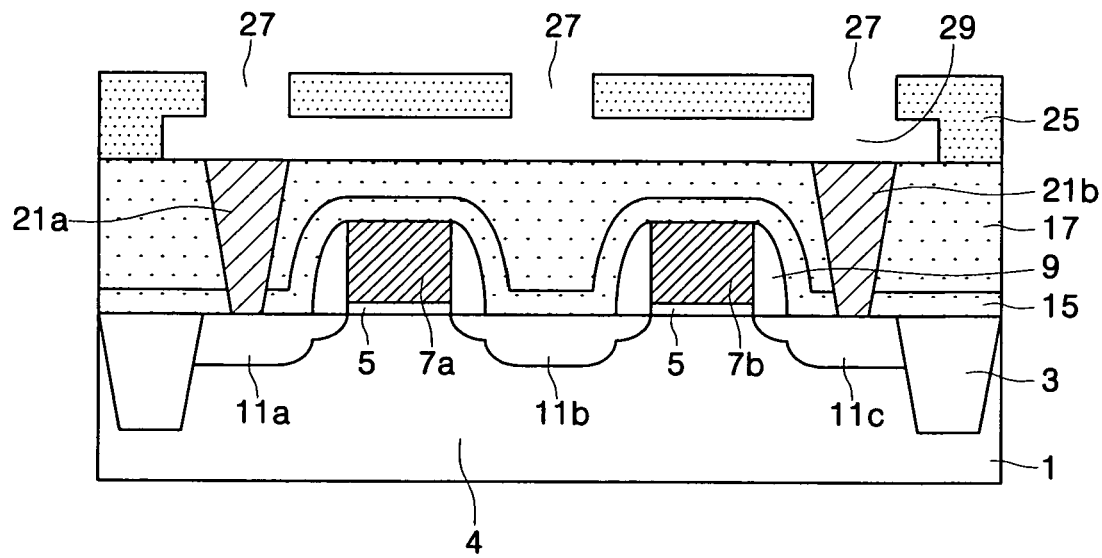

Referring to FIG. 5, the sacrificial layer pattern 23 is removed to form a cavity 29 in the capping layer 25. As described above, the interlayer insulating layer 17 may be formed of a HDP oxide layer, and the sacrificial layer pattern 23 may be formed of a FOX layer or a SOG layer which has relatively porous film quality as compared to the HDP oxide layer. In addition, the capping layer 25 may be formed of a silicon nitride layer or a silicon oxynitride layer. In this case, the sacrificial layer pattern 23 may be selectively removed using an oxide etchant. This is because an etch rate of the FOX layer or the SOG layer in the oxide etchant is faster than that of the HDP oxide layer in the oxide etchant. The oxide etchant may be a buffer oxide etchant (BOE) or a mixture of the BOE and a first standard cleaning solution (SC1). In this case, the SC1 is a chemical solution containing ammonium hydroxide ($NH_4OH$), hydrogen peroxide ($H_2O_2$) and de-ionized water.

Figure 6:
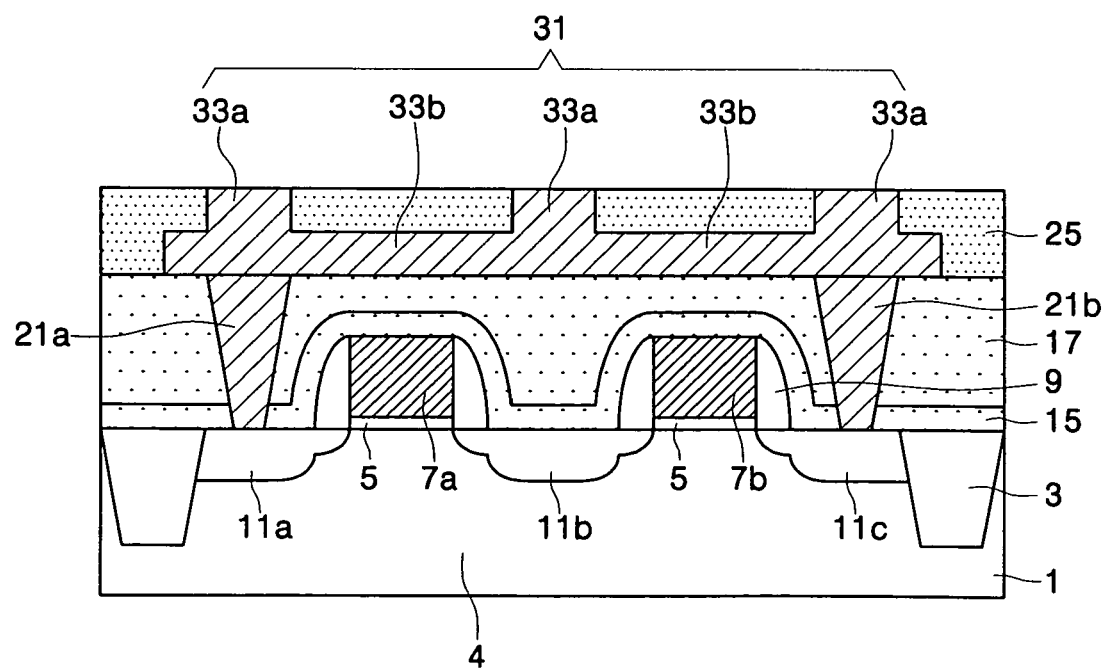

Referring to FIG. 6, a planarized single crystalline semiconductor body pattern 31 is formed to fill the cavity 29 and the openings 27. The single crystalline semiconductor body pattern 31 may include at least two elevated regions 33a and at least one recessed region 33b. For example, the single crystalline semiconductor body pattern 31 may be formed to have three elevated regions 33a and two recessed regions 33b as shown in FIG. 6. The elevated regions 33a are formed to fill the openings 27 and the cavity 29 below the openings 27, and the recessed regions 33b are formed to fill the cavity 29 between the elevated regions 33a. Accordingly, top surfaces of the recessed regions 33b may be lower than top surfaces of the elevated regions 33a. The recessed regions 33b may be formed to have a uniform thickness corresponding to the thickness of the sacrificial layer pattern 23.

The single crystalline semiconductor body pattern 31 may be formed by growing a single crystalline semiconductor body layer using a selective epitaxial growth (SEG) technique that employs the first and second single crystalline semiconductor contact plugs 21a and 21b as seed layers and by planarizing the single crystalline semiconductor body layer until the capping layer 25 is exposed. The planarization of the single crystalline semiconductor body layer may be performed using a CMP technique. Only the single crystalline semiconductor body layer in the openings 27 may be planarized during the planarization of the single crystalline semiconductor body layer, and the recessed regions 33b may be protected from the CMP process because of the presence of the capping layer 25. That is, even though the single crystalline semiconductor body layer is planarized using the CMP process, the capping layer 25 prevents any physical etching damage from being applied to the recessed regions 33b in the cavity 29. When the first and second single crystalline semiconductor contact plugs 21a and 21b are single crystalline silicon plugs, the single crystalline semiconductor body pattern 31 may be a single crystalline silicon pattern.

Figure 7:
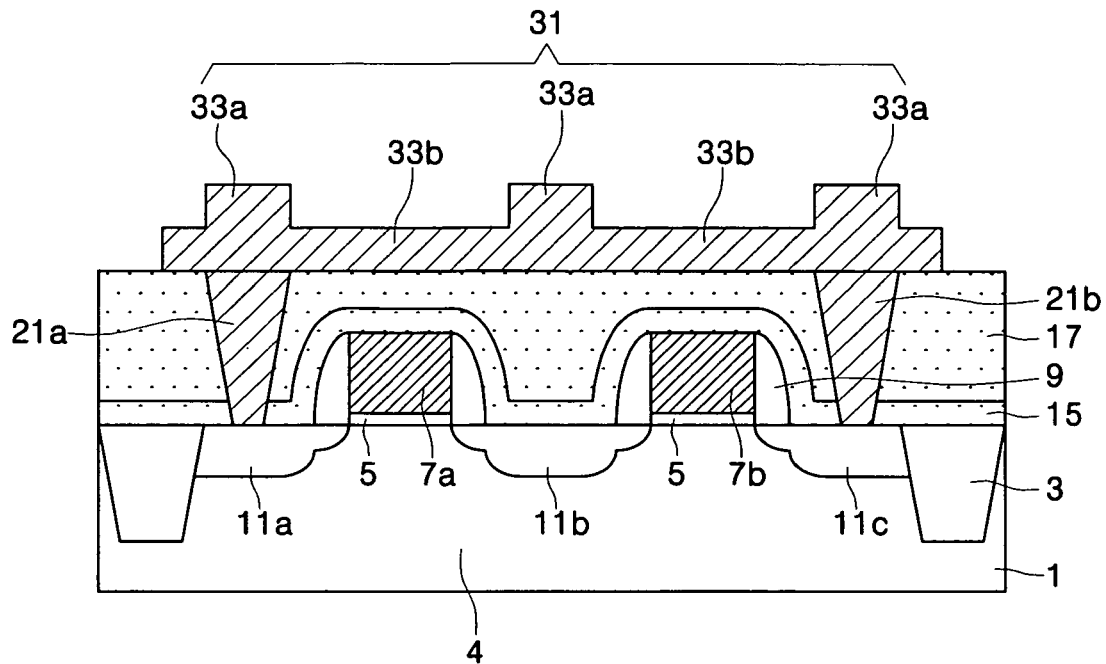

Referring to FIG. 7, the capping layer 25 is removed to expose an entire surface of the single crystalline semiconductor body pattern 31. When the capping layer 25 is formed of a silicon nitride layer or a silicon oxynitride layer and the interlayer insulating layer 17 is formed of a silicon oxide layer such as a HDP oxide layer, the capping layer 25 may be selectively removed using phosphoric acid ($H_3PO_4$).

Figure 8:
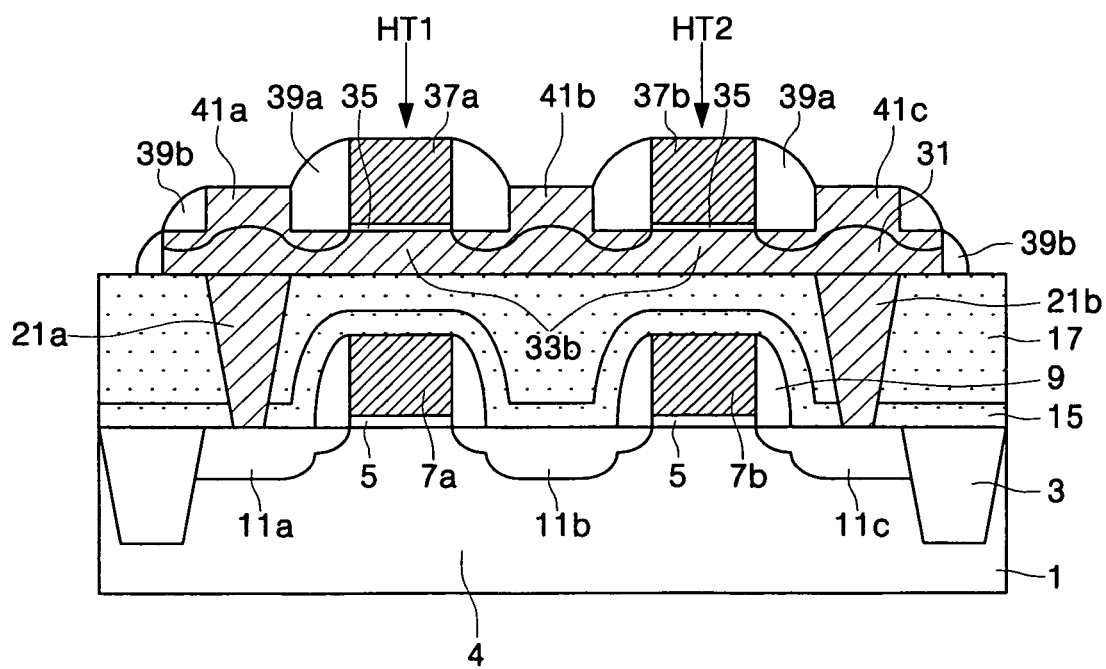

Referring to FIG. 8, an upper gate insulating layer 35 and an upper gate material layer are sequentially formed on the single crystalline semiconductor body pattern 31. The upper gate material layer may be formed by sequentially stacking a gate conductive layer and a gate capping layer. Alternatively, the upper gate material layer may be formed of only the gate conductive layer. The gate conductive layer may be formed of a doped polysilicon layer or a metal layer, and the gate capping layer may be formed of an insulating layer such as a silicon oxide layer or a silicon nitride layer. The upper gate material layer is patterned to form first and second upper gate patterns 37a and 37b crossing over the recessed regions 33b. The upper gate insulating layer 35 may also be patterned during formation of the upper gate patterns 37a and 37b. The upper gate patterns 37a and 37b may be formed to completely fill spaces on the recessed regions 33b or to cross over center portions of the recessed regions 33b.

Third impurity ions are implanted into the elevated region 33a of the single crystalline semiconductor body pattern 31 using the upper gate patterns 37a and 37b as ion implantation masks to thereby form low concentration impurity regions. When the upper gate patterns 37a and 37b are formed to cross over the center portions of the recessed regions 33b as shown in FIG. 8, the low concentration impurity regions may be formed in edges of the recessed regions 33b. The third impurity ions may be impurity ions having a different conductivity type from the lower impurity regions 11a, 11b and 11c. For example, the third impurity ions may be P-type impurity ions. The process of forming the low concentration impurity regions may be omitted.

Upper insulating spacers 39a may be formed on sidewalls of the upper gate patterns 37a and 37b. The upper insulating spacers 39a may be formed by depositing an insulating layer such as a silicon nitride layer on the interlayer insulating layer 17 so as to cover the upper gate patterns 37a and 37b and the single crystalline semiconductor body pattern 31 and by etching back the insulating layer. In this case, upper insulating spacers 39b may also be formed on outer sidewalls of the single crystalline semiconductor body pattern 31. The upper insulating spacers 39a on the sidewalls of the upper gate patterns 37a and 37b are preferably formed to completely cover the sidewalls of the elevated regions 33a.

Fourth impurity ions are implanted into the low concentration impurity regions in the elevated regions 33a using the upper gate patterns 37a and 37b and the upper insulating spacers 39a as ion implantation masks to form high concentration impurity regions. The fourth impurity ions may have the same conductivity type as the third impurity ions. Consequently, first to third upper impurity regions 41a, 41b and 41c composed of the low concentration impurity regions and the high concentration impurity regions are formed in the single crystalline semiconductor body pattern 31. In this case, the first to third upper impurity regions 41a, 41b and 41c are formed to have an LDD structure. The upper impurity regions 41a, 41b and 41c may extend to reach a lower surface of the single crystalline semiconductor body pattern 31.

The first upper gate pattern 37a, the first upper impurity region 41a and the second upper impurity region 41b constitute a first upper transistor HT1. In this case, the first and second upper impurity regions 41a and 41b may act as a source region (or a drain region) and a drain region (or a source region) of the first upper transistor HT1, respectively. The second upper gate pattern 37b, the second upper impurity region 41b and the third upper impurity region 41c constitute a second upper transistor HT2. In this case, the second and third upper impurity regions 41b and 41c may act as a drain region (or a source region) and a source region (or a drain region) of the second upper transistor HT2, respectively. Accordingly, the upper impurity regions 41a, 41b and 41c provide self-aligned elevated source/drain regions of the upper transistors HT1 and HT2.

Furthermore, the first and second upper transistors HT1 and HT2 may be thin film transistors having recessed gate electrodes which become relatively lowered as compared to the elevated source/drain regions 41a, 41b and 41c. The first and second upper transistors HT1 and HT2 may be P-channel thin film transistors. In addition, the recessed regions 33b in which channels of the upper transistors HT1 and HT2 are formed are not physically damaged during the planarization process for forming the single crystalline semiconductor body pattern 31, as described with reference to FIG. 6. Accordingly, reliability of the upper transistors HT1 and HT2 may be enhanced.

Methods of fabricating the semiconductor integrated circuit devices according to the above-described embodiments of the present invention may be applicable to the fabrication of an SRAM cell. In this case, the first and second lower transistors LT1 and LT2 may correspond to a pair of access transistors or a pair of driver transistors of the SRAM cell, and the first and second upper transistors HT1 and HT2 may correspond to a pair of load thin film transistors of the SRAM cell.

Hereinafter, structures of the semiconductor integrated circuit devices according to embodiments of the present invention will be described with reference to FIG. 8.

Referring to FIG. 8, an isolation layer 3 is provided in a predetermined region of a semiconductor substrate 1 to define an active region 4. First to third lower impurity regions 11a, 11b, and 11c are provided in the active region 4. A first lower gate pattern 7a is disposed to cross over a channel region between the first and second lower impurity regions 11a and 11b, and a second lower gate pattern 7b is disposed to cross over a channel region between the second and third lower impurity regions 11b and 11c. The first lower gate pattern 7a, the first lower impurity region 11a and the second lower impurity region 11b constitute a first lower transistor, and the second lower gate pattern 7b, the second lower impurity region 11b and the third lower impurity region 11c constitute a second lower transistor. The first to third lower impurity regions 11a, 11b and 11c may be N-type source/drain regions.

An interlayer insulating layer 17 is provided on the substrate having the first and second lower transistors. An etch stop layer 15 may be interposed between the lower transistors and the interlayer insulating layer 17. The first lower impurity region 11a is in contact with a first single crystalline semiconductor contact plug 21a penetrating the etch stop layer 15 and the interlayer insulating layer 17. Similarly, the third lower impurity region 11c is in contact with a second single crystalline semiconductor contact plug 21b penetrating the etch stop layer 15 and the interlayer insulating layer 17. When the semiconductor substrate 1 is a single crystalline silicon substrate, the single crystalline semiconductor contact plugs 21a and 21b may be single crystalline silicon plugs.

A single crystalline semiconductor body pattern 31 is provided on the interlayer insulating layer 17. The single crystalline semiconductor body pattern 31 may be disposed to be in contact with the single crystalline semiconductor contact plugs 21a and 21b. Further, the single crystalline semiconductor body pattern 31 may include a plurality of elevated regions (33a of FIG. 7) separated from one another, for example, three elevated regions. In addition, the single crystalline semiconductor body pattern 31 includes at least one recessed region 33b between the elevated regions, for example, two recessed regions. The recessed regions 33b have surfaces lower than surfaces of the elevated regions. When the single crystalline semiconductor contact plugs 21a and 21b are single crystalline silicon plugs, the single crystalline semiconductor body pattern 31 may be a single crystalline silicon pattern.

First and second upper transistors HT1 and HT2 are provided at the single crystalline semiconductor body pattern 31.

The first upper transistor HT1 includes a first upper gate pattern 37a, a first upper impurity region 41a and a second upper impurity region 41b. The first upper gate pattern 37a is disposed to cross over one recessed region of the recessed regions 33b, and the first and second upper impurity regions 41a and 41b are provided in the elevated regions located at both sides of the first upper gate pattern 37a respectively. Similarly, the second upper transistor HT2 includes the second upper impurity region 41b, a second upper gate pattern 37b and a third upper impurity region 41c. The second upper gate pattern 37b is disposed to cross over the recessed region 33b which is adjacent to the second upper impurity region 41b and is located opposite to the first upper gate pattern 37a, and the third upper impurity region 41c is provided in the elevated region which is adjacent to the second upper gate pattern 37b and is located opposite to the second upper impurity region 41b. The first to third upper impurity regions 41a, 41b and 41c may be P-type impurity regions.

The first and second lower transistors may be a pair of driver transistors or a pair of access transistors of an SRAM cell, and the first and second upper transistors may be a pair of load transistors of the SRAM cell.

As described above, semiconductor integrated circuit devices according to the embodiments of the present invention comprise thin film transistors fabricated at a single crystalline semiconductor body pattern which is formed using a selective epitaxial growth technique. Accordingly, the single crystalline thin film transistors may have the characteristics corresponding to that of the bulk transistor. Further, the single crystalline thin film transistors may be suitable for a highly integrated semiconductor integrated circuit device. In addition, the single crystalline semiconductor body pattern has elevated regions, and impurity regions such as source/drain regions are formed in the elevated regions. That is, the single crystalline thin film transistor having elevated source/drain regions may be formed using the single crystalline semiconductor body pattern. As a result, a short channel effect of the single crystalline thin film transistor may be suppressed. The recessed region of the single crystalline semiconductor body pattern acts as a channel region of the single crystalline TFT, and the recessed region is not damaged during planarization process for forming the single crystalline semiconductor body pattern. Thus, the film quality of the recessed region may be enhanced, thereby improving the characteristics of the single crystalline TFT. In addition, the thickness of the single crystalline semiconductor body pattern may be easily adjusted by controlling the thickness of the sacrificial layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor integrated circuit device, comprising:
a first transistor formed at a semiconductor substrate, the first transistor having first and second impurity regions of a first conductivity type formed in the semiconductor substrate and a first gate electrode disposed over a channel region between the first and second impurity regions of the first conductivity type;
an interlayer insulating layer formed on the first transistor;
a single crystalline semiconductor body pattern formed on the interlayer insulating layer, the single crystalline semiconductor body pattern being a single layer and having at least two elevated regions spaced apart from each other; and
a second transistor formed at the single crystalline semiconductor body pattern, the second transistor having first and second impurity regions of a second conductivity type formed in the elevated regions and a second gate electrode disposed on the single crystalline semiconductor body pattern between the first and second impurity regions of the second conductivity type.

2. The semiconductor integrated circuit device according to claim 1, wherein the first conductivity type is N-type.

3. The semiconductor integrated circuit device according to claim 1, wherein the second conductivity type is P-type.

4. The semiconductor integrated circuit device according to claim 1, further comprising a single crystalline semiconductor plug formed in the interlayer insulating layer to be in contact with one of the first and second impurity regions of the first transistor.

5. The semiconductor integrated circuit device according to claim 4, wherein the single crystalline semiconductor plug is a single crystalline silicon plug.

6. The semiconductor integrated circuit device according to claim 1, wherein the single crystalline semiconductor body pattern is a single crystalline silicon pattern.

7. The semiconductor integrated circuit device according to claim 1, wherein the single crystalline semiconductor body pattern comprises at least one recessed region between the elevated regions.

8. The semiconductor integrated circuit device according to claim 7, wherein the second gate electrode is disposed over the recessed region of the single crystalline semiconductor body pattern.

9. The semiconductor integrated circuit device according to claim 8, wherein the second gate electrode is a recessed gate electrode.

10. The semiconductor integrated circuit device according to claim 1, wherein the first transistor is one of an access transistor and a driver transistor of a static random access memory (SRAM) cell.

11. The semiconductor integrated circuit device according to claim 10, wherein the second transistor is a load transistor of the SRAM cell.

* * * * *